(12) United States Patent
Chen et al.

(10) Patent No.: US 11,788,679 B2
(45) Date of Patent: Oct. 17, 2023

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Kai-Wen Yu, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 17/643,923

(22) Filed: Dec. 13, 2021

(65) Prior Publication Data
US 2023/0107056 A1    Apr. 6, 2023

(30) Foreign Application Priority Data
Oct. 5, 2021 (TW) .................................. 110137254

(51) Int. Cl.
*F16M 13/02* (2006.01)
(52) U.S. Cl.
CPC .................................. *F16M 13/02* (2013.01)

(58) Field of Classification Search
CPC ...... H05K 7/1489; H05K 7/183; A47B 96/07; A47B 2088/4235
See application file for complete search history.

(56) References Cited

U.S. PATENT DOCUMENTS

| | | | |
|---|---|---|---|
| 9,572,277 B2 * | 2/2017 | Chen | H05K 7/183 |
| 9,629,460 B1 | 4/2017 | Chen et al. | |
| 10,085,561 B2 * | 10/2018 | Chen | A47B 96/07 |
| 10,194,556 B2 | 1/2019 | Chen et al. | |
| 10,278,498 B2 | 5/2019 | Chen et al. | |
| 10,980,345 B2 | 4/2021 | Chen et al. | |
| 2021/0337695 A1 | 10/2021 | Chen et al. | |

FOREIGN PATENT DOCUMENTS

| | | |
|---|---|---|
| EP | 3644695 A1 | 4/2020 |
| EP | 3905865 A1 | 11/2021 |

* cited by examiner

*Primary Examiner* — Terrell L McKinnon
*Assistant Examiner* — Jerry Olivier
(74) *Attorney, Agent, or Firm* — Rosenberg, Klein & Lee

(57) ABSTRACT

A slide rail assembly includes a rail member ad a bracket device. The bracket device can be displaced with respect to the rail member and is provided with a first structure. The rail member is provided with a second structure. When the bracket device is at a predetermined position with respect to the rail member, the first structure and the second structure are blocked by each other to prevent the bracket device from being displaced with respect to the rail member in either of a first direction and a second direction.

18 Claims, 13 Drawing Sheets

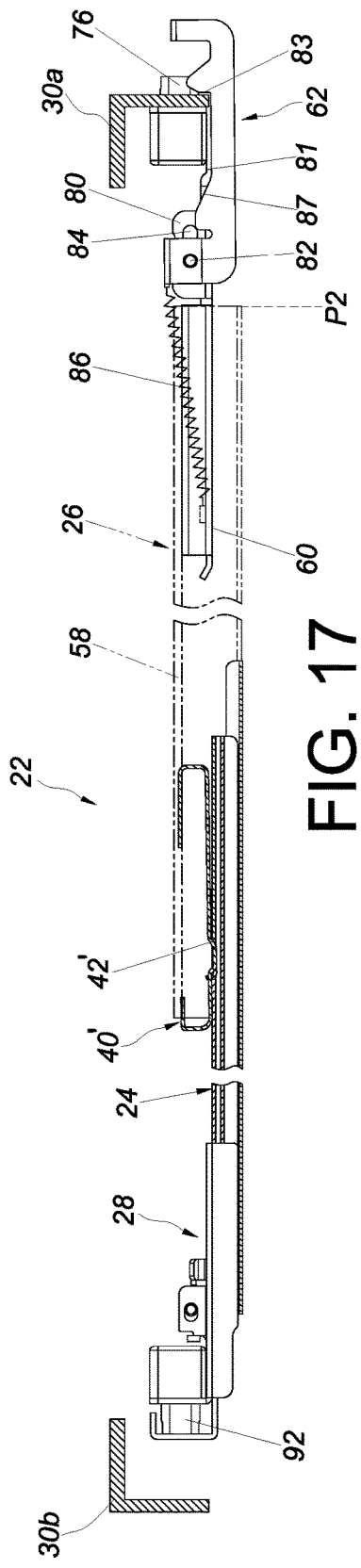
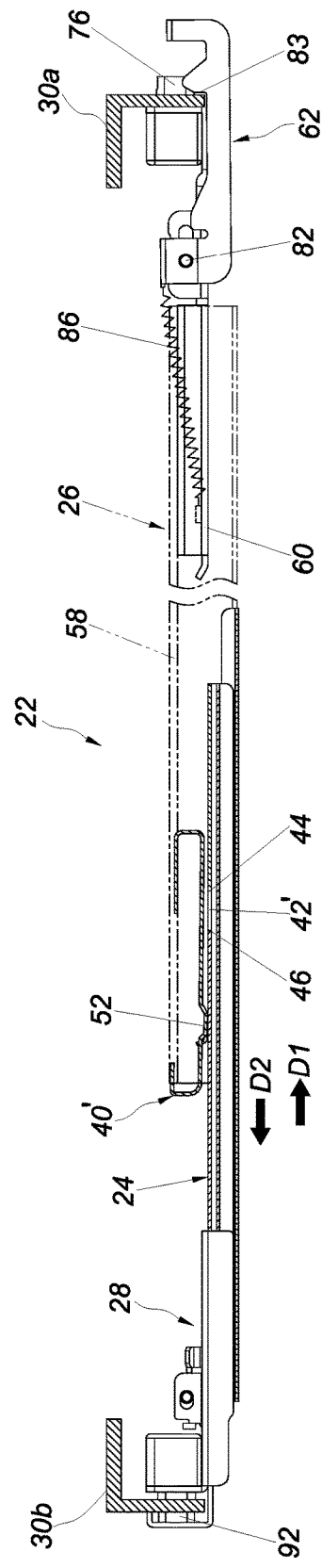
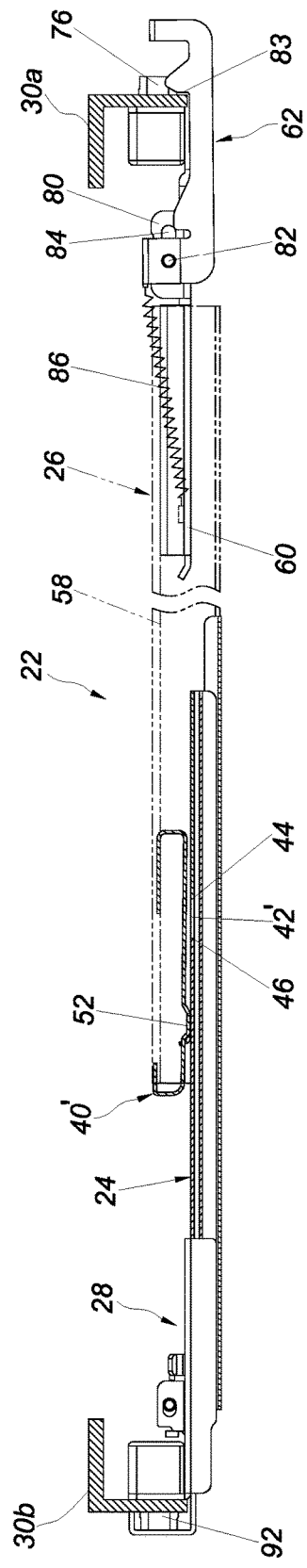
FIG. 17
FIG. 18
FIG. 19

SLIDE RAIL ASSEMBLY

FIELD OF THE INVENTION

The present invention relates to a slide rail and more particularly to a slide rail assembly with a bracket device.

BACKGROUND OF THE INVENTION

U.S. Pat. No. 10,980,345 B2 discloses a bracket assembly that includes a first bracket and a second bracket. The first bracket and the second bracket can be displaced with respect to each other. The first bracket is provided with a first feature (e.g., a projection), and the second bracket is provided with a second feature (e.g., an elastic arm). When the first bracket and the second bracket are extended with respect to each other to a predetermined length, the first feature and the second feature abut against each other to set a limit on the relative displacement of (i.e., on the adjustment of distance between) the first bracket and the second bracket, with a view to safety.

While the first bracket and the second bracket disclosed in the afore-cited patent have a blocking function when extended with respect to each other to the predetermined length, the blocking function provides blockage in one direction only. To mount the bracket assembly on a rack, therefore, it is required that a first person stand behind the rack to perform the mounting operation, and that a second person stand in front of the rack to assist in the mounting operation. Only by doing so can the mounting operation be completed. The bracket assembly, therefore, lacks convenience of use.

U.S. Pat. No. 9,629,460 B1, granted to Chen, et al. discloses a slide rail assembly that can be mounted on a rack by a single person. In practice, however, this slide rail assembly can only be mounted on racks whose depths are within a certain range due to the fact that the rail of the slide rail assembly is configured for extensible/retractable displacement. If the depth of the rack on which the slide rail assembly is to be mounted is outside the aforesaid range (e.g., if the rack depth is too small or too great), the slide rail assembly either cannot be mounted or will have insufficient mounting strength. As user needs vary, it is important to develop a different product from those cited above.

SUMMARY OF THE INVENTION

One objective of the present invention is to provide a slide rail assembly having a bracket device.

Another objective of the present invention is to provide a slide rail assembly that has a detachable bracket device replaceable by similar bracket devices of different lengths, and that can be mounted on and detached from a rack by a single person.

According to one aspect of the present invention, a slide rail assembly includes a rail member and a first bracket device. The first bracket device can be displaced with respect to the rail member. The first bracket device is provided with a first structure, and the rail member is provided with a second structure. The first structure and the second structure are configured to be blocked by each other when the first bracket device and the rail member are at a predetermined position with respect to each other. One of the first structure and the second structure is an elastic member. When the first structure and the second structure are blocked by each other, and the external force applied to effect relative displacement between the first bracket device and the rail member is less than the force generated by the elastic member, the first bracket device and the rail member are prevented from being displaced with respect to each other in either of a first direction and a second direction, wherein the first direction and the second direction are opposite directions.

Preferably, the elastic member is configured to be operated so as to stop blocking, and being blocked by, the other of the first structure and the second structure, thereby allowing the first bracket device and the rail member to be displaced with respect to each other in either of the first direction and the second direction.

Preferably, when the elastic member stops blocking, and being blocked by, the other of the first structure and the second structure, the first bracket device can be displaced with respect to the rail member in the first direction in order to be detached from the rail member.

Preferably, the first bracket device has a first length, and the slide rail assembly further includes a second bracket device having a second length different from the first length. The second bracket device is configured to be mounted to the rail member in the second direction after the first bracket device is detached from the rail member.

Preferably, the other of the first structure and the second structure is a space; the elastic member includes a connecting portion, an operating portion, and an elastic portion located between the connecting portion and the operating portion; the connecting portion is connected to one of the first bracket device and the rail member; and the elastic portion includes a first blocking section and a second blocking section. When the first bracket device and the rail member are at the predetermined position with respect to each other, the first blocking section and the second blocking section of the elastic portion of the elastic member correspond to a first wall portion and a second wall portion of the space respectively to prevent the first bracket device and the rail member from being displaced with respect to each other in either of the first direction and the second direction.

Preferably, when the first bracket device and the rail member are at the predetermined position with respect to each other, and the elastic member is operated, the first blocking section and the second blocking section of the elastic portion of the elastic member are stopped from corresponding to the first wall portion and the second wall portion of the space respectively, thereby allowing the first bracket device and the rail member to be displaced with respect to each other in either of the first direction and the second direction.

Preferably, the second blocking section has a guiding feature, and the guiding feature is configured to work with the second wall portion of the space.

Preferably, the elastic member is provided at a position adjacent to an end portion of the first bracket device.

Preferably, the rail member is further provided with a bracket mechanism. The first bracket device is configured to be mounted on a first post of a rack, and the rail member is configured to be mounted on a second post of the rack via the bracket mechanism.

Preferably, the slide rail assembly further includes at least one movable rail that can be displaced with respect to the rail member.

According to another aspect of the present invention, a slide rail assembly includes a rail member and a first bracket device. The first bracket device can be displaced with respect to the rail member between a retracted position and an extended position. The first bracket device is provided with a first structure, and the rail member is provided with a second structure. One of the first structure and the second structure is an elastic member. The first structure and the second structure are configured to be blocked by each other when the first bracket device reaches the extended position after being displaced with respect to the rail member from the retracted position in a first direction. When the first structure and the second structure are blocked by each other, and the external force applied to effect relative displacement between the first bracket device and the rail member is less than the force generated by the elastic member, the first bracket device is prevented from being displaced with respect to the rail member in either of the first direction and a second direction, wherein the first direction and the second direction are opposite directions.

Preferably, the elastic member is configured to be operated so as to stop blocking, and being blocked by, the other of the first structure and the second structure, thereby allowing the first bracket device to be displaced with respect to the rail member in either of the first direction and the second direction.

Preferably, when the elastic member stops blocking, and being blocked by, the other of the first structure and the second structure, the first bracket device can be displaced with respect to the rail member in the first direction in order to be detached from the rail member.

Preferably, the first bracket device has a first length, and the slide rail assembly further includes a second bracket device having a second length different from the first length. The second bracket device is configured to be mounted to the rail member in the second direction after the first bracket device is detached from the rail member.

Preferably, the other of the first structure and the second structure is a space; the elastic member includes a connecting portion, an operating portion, and an elastic portion located between the connecting portion and the operating portion; the connecting portion is connected to one of the first bracket device and the rail member; and the elastic portion includes a first blocking section and a second blocking section. When the first bracket device is at the extended position with respect to the rail member, the first blocking section and the second blocking section of the elastic portion of the elastic member correspond to a first wall portion and a second wall portion of the space respectively to prevent the first bracket device from being displaced with respect to the rail member in either of the first direction and the second direction.

Preferably, when the first bracket device is at the extended position with respect to the rail member, and the elastic member is operated, the first blocking section and the second blocking section of the elastic portion of the elastic member are stopped from corresponding to the first wall portion and the second wall portion of the space respectively, thereby allowing the first bracket device to be displaced with respect to the rail member in either of the first direction and the second direction.

Preferably, the second blocking section has a guiding feature, and the guiding feature is configured to work with the second wall portion of the space.

Preferably, the rail member is further provided with a bracket mechanism. The first bracket device is configured to be mounted on a first post of a rack, and the rail member is configured to be mounted on a second post of the rack via the bracket mechanism.

According to yet another aspect of the present invention, a slide rail assembly includes a rail member and a first bracket device. The rail member has a space, and the space has a first wall portion and a second wall portion. The first bracket device can be displaced with respect to the rail member and is provided with an elastic member. The elastic member includes a first blocking section and a second blocking section. When the first bracket device and the rail member are at an extended position with respect to each other, the first blocking section and the second blocking section of the elastic member correspond to the first wall portion and the second wall portion of the space respectively to prevent the first bracket device and the rail member from being displaced with respect to each other in either of a first direction and a second direction. The elastic member is configured to be operated so as to stop the first blocking section and the second blocking section of the elastic member from corresponding to the first wall portion and the second wall portion of the space respectively, thereby allowing the first bracket device to be displaced with respect to the rail member in the first direction in order to be detached from the rail member.

Preferably, the first bracket device has a first length, and the slide rail assembly further includes a second bracket device having a second length different from the first length. The second bracket device is configured to be mounted to the rail member in the second direction after the first bracket device is detached from the rail member. The first direction and the second direction are opposite directions.

BRIEF DESCRIPTION OF THE DRAWINGS

FIG. 17 shows the third step of mounting the slide rail assembly on the rack in accordance with the embodiment of the present invention;

FIG. 18 shows the fourth step of mounting the slide rail assembly on the rack in accordance with the embodiment of the present invention; and FIG. 19 shows that the slide rail assembly is mounted on a first post and a second post of the rack in accordance with the embodiment of the present invention.

DETAILED DESCRIPTION OF THE INVENTION

Figure 1:
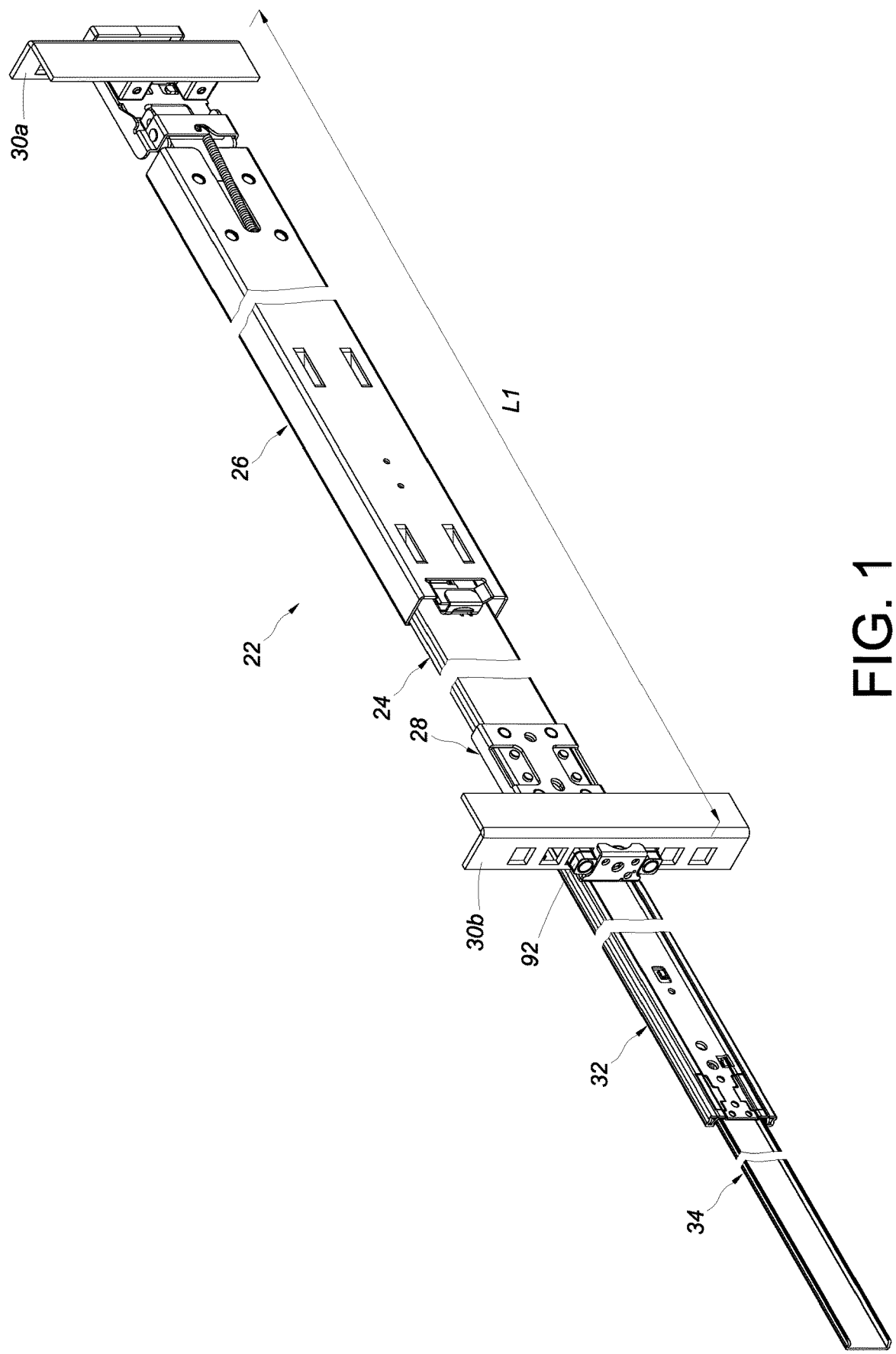
FIG. 1 is a perspective view of the slide rail assembly according to an embodiment of the present invention, wherein the slide rail assembly is mounted on a rack.

Referring to FIG. 1, the slide rail assembly 22 according to an embodiment of the present invention is mounted on a rack. The slide rail assembly 22 includes a rail member 24 and a first bracket device 26. Preferably, the rail member 24 is provided with a bracket mechanism 28, and here the bracket mechanism 28 is connected (such as, but not limited to, fixedly connected) to the rail member 24. The first bracket device 26 is configured to be mounted on a first post 30a of the rack. The rail member 24 is configured to be mounted on a second post 30b of the rack via the bracket mechanism 28. The first post 30a and the second post 30b define a first longitudinal distance L1 (or a first rack depth) therebetween. The first post 30a and the second post 30b have substantially the same structural configuration.

Preferably, the slide rail assembly 22 further includes at least one movable rail that can be displaced with respect to the rail member 24. Here, the at least one movable rail includes a first movable rail 32 and a second movable rail 34 by way of example. The rail member 24 (e.g., an outer rail), the first movable rail 32 (e.g., a middle rail), and the second movable rail 34 (e.g., an inner rail) constitute a three-section slide rail assembly. The first movable rail 32 is movably mounted between the rail member 24 and the second movable rail 34. The second movable rail 34 is configured to be mounted with an object (not shown) to be carried by the slide rail assembly, so that the object can be pulled out of and retracted into the rack through the second movable rail 34.

Figure 2:
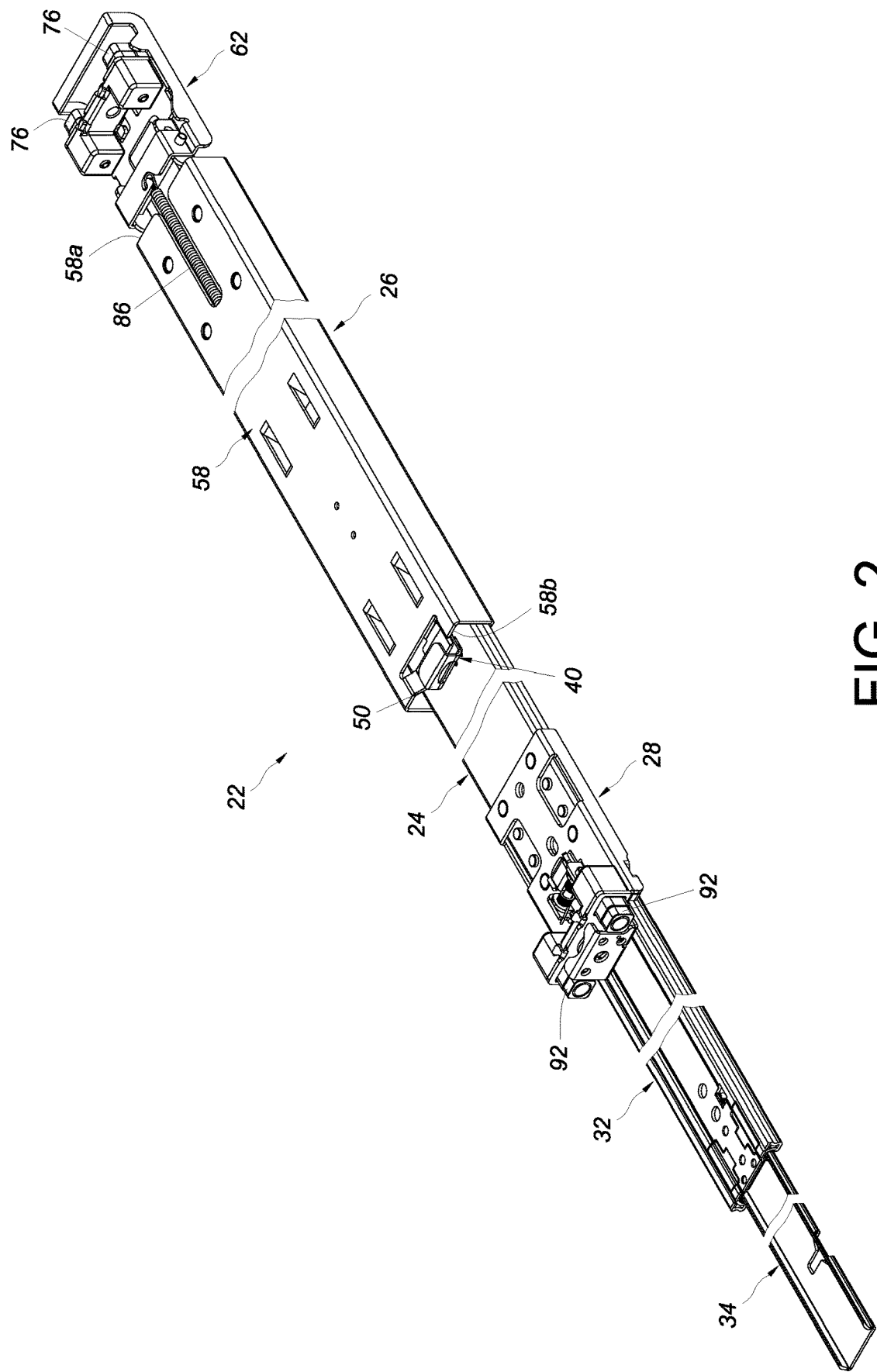
FIG. 2 is an assembled perspective view of the slide rail assembly according to the embodiment of the present invention.
Figure 3:
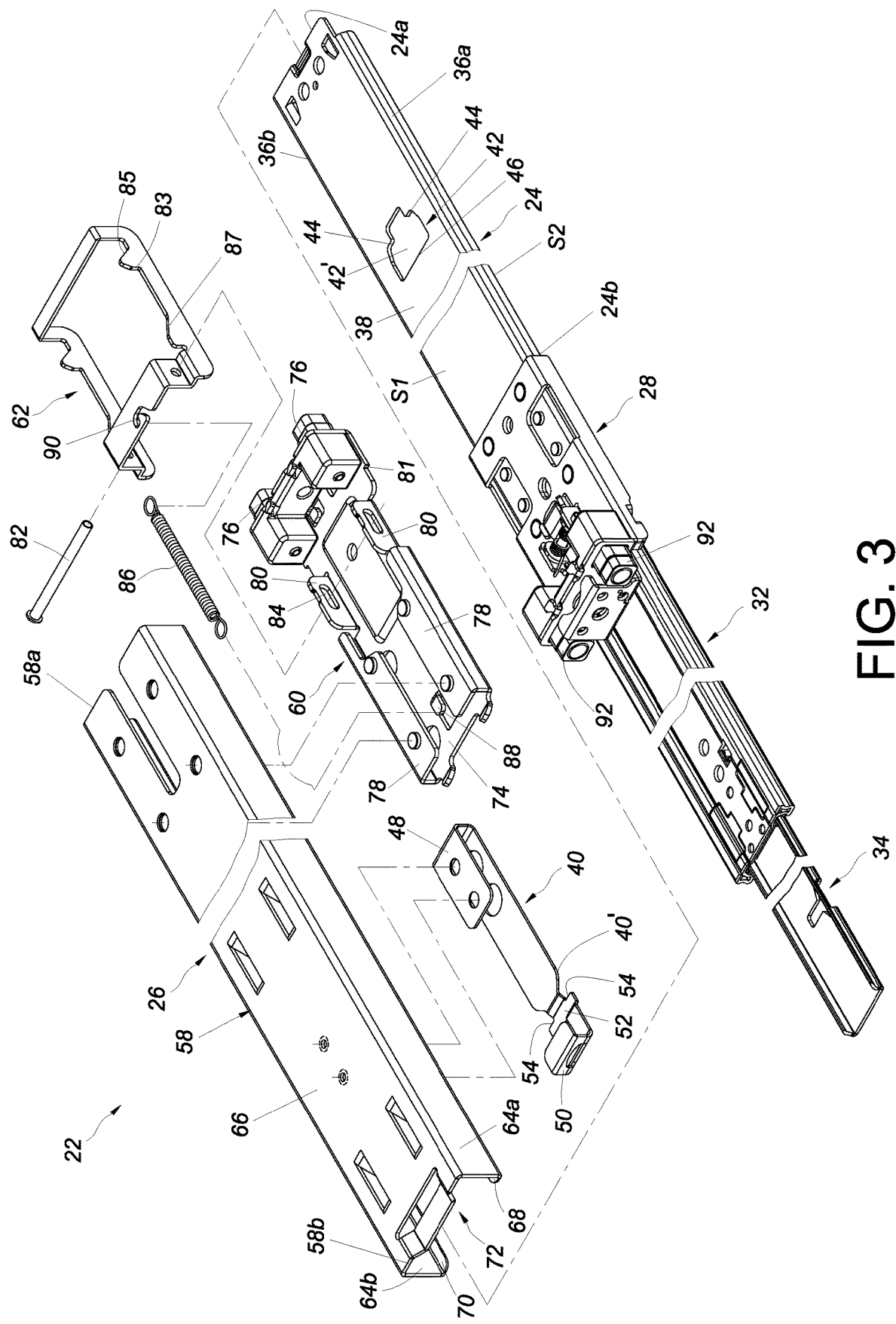
FIG. 3 is an exploded perspective view of the slide rail assembly according to the embodiment of the present invention.

As shown in FIG. 2 and FIG. 3, the rail member 24 includes a first wall 36a, a second wall 36b, and a longitudinal wall 38 connected between the first wall 36a and the second wall 36b of the rail member 24. The rail member 24 has two opposite end portions defined respectively as a first end portion 24a and a second end portion 24b, such as but not limited to a rear portion and a front portion. The bracket mechanism 28 is adjacent to the second end portion 24b of the rail member 24. The first bracket device 26, on the other hand, is movably mounted at a position adjacent to the first end portion 24a. The first bracket device 26 is provided with a first structure 40, and the rail member 24 is provided with a second structure 42.

Figure 4:
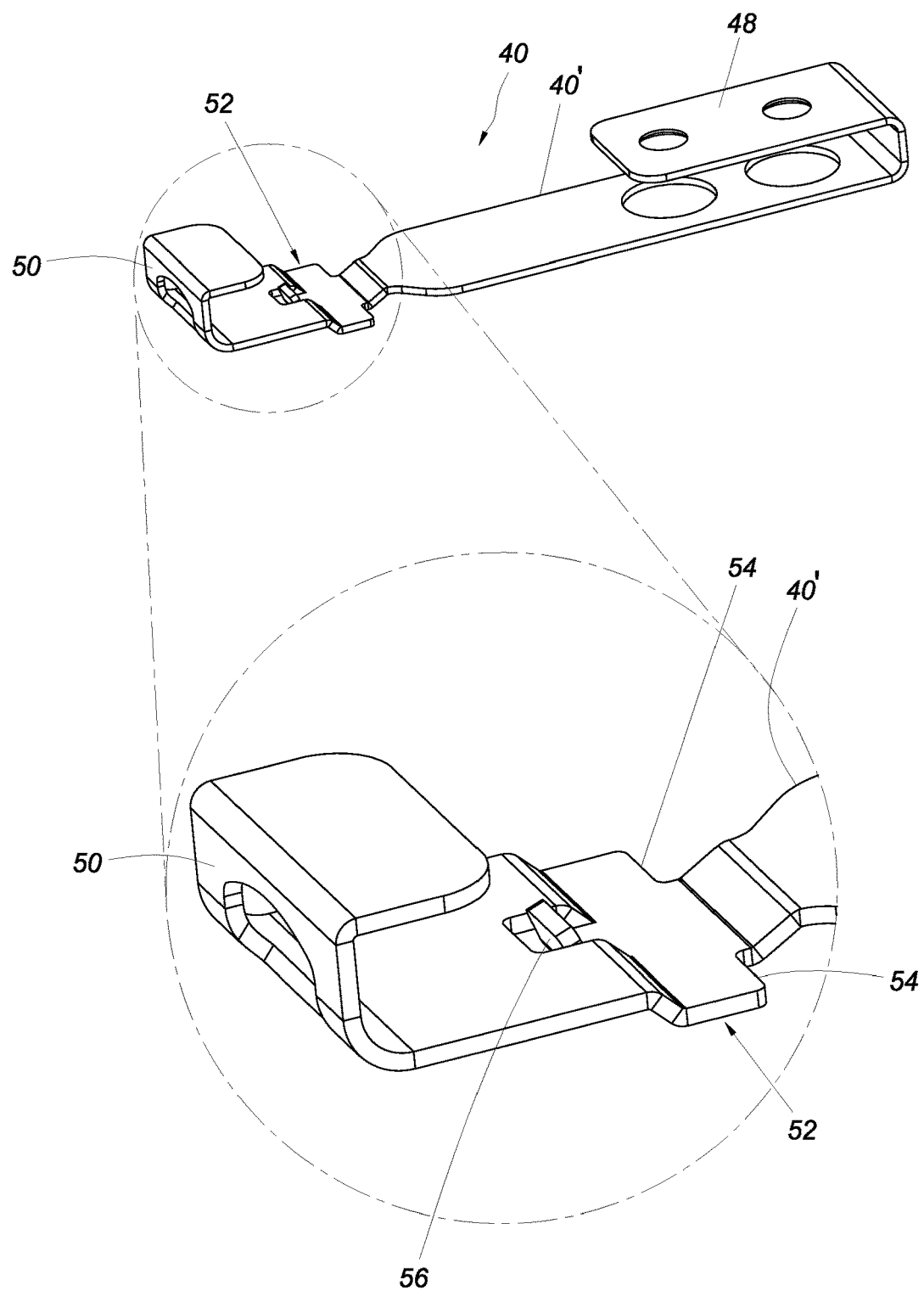
FIG. 4 is a perspective view of the elastic member of the slide rail assembly according to the embodiment of the present invention.

Preferably, one of the first structure 40 and the second structure 42 is an elastic member 40', and the other of the first structure 40 and the second structure 42 is a space 42' (e.g., an opening). Here, by way of example, the first structure 40 is the elastic member 40', and the second structure 42 is the space 42'. More specifically, the longitudinal wall 38 of the rail member 24 is provided with the space 42', and the space 42' has at least one first wall portion 44 and a second wall portion 46 facing the at least one first wall portion 44. The elastic member 40' includes a connecting portion 48, an operating portion 50, and an elastic portion 52 located between the connecting portion 48 and the operating portion 50. The connecting portion 48 is connected to the first bracket device 26. The elastic portion 52 includes at least one first blocking section 54 and a second blocking section 56 (see FIG. 4).

Preferably, the first bracket device 26 includes an extending support frame 58, a bracket 60, and a fastener 62. The extending support frame 58 includes a first portion 64a, a second portion 64b, and a longitudinal portion 66 connected between the first portion 64a and the second portion 64b of the extending support frame 58. Both the first portion 64a and the second portion 64b are bent with respect to the longitudinal portion 66. Here, the first portion 64a and the second portion 64b are substantially perpendicularly connected to the longitudinal portion 66 by way of example only.

Preferably, the first portion 64a and the second portion 64b of the extending support frame 58 have a first bent portion 68 and a second bent portion 70 respectively. The first bent portion 68 is substantially perpendicularly connected to the first portion 64a, and the second bent portion 70 is substantially perpendicularly connected to the second portion 64b.

Preferably, the first portion 64a, the first bent portion 68, the second portion 64b, the second bent portion 70, and the longitudinal portion 66 of the extending support frame 58 jointly define a support frame channel 72, and a portion of the rail member 24 that includes the space 42' can be inserted into the support frame channel 72 to allow the first bracket device 26 and the rail member 24 to be longitudinally displaced with respect to each other.

Preferably, the connecting portion 48 of the elastic member 40' is connected (such as, but not limited to, fixedly connected) to the longitudinal portion 66 of the extending support frame 58 of the first bracket device 26, the elastic portion 52 of the elastic member 40' is in the support frame channel 72, and the operating portion 50 of the elastic member 40' is outside the support frame channel 72.

Preferably, the extending support frame 58 has two opposite end portions defined respectively as a first end portion 58a and a second end portion 58b, such as but not limited to a rear portion and a front portion. The elastic member 40' is provided adjacent to the second end portion 58b of the extending support frame 58 so that a user can easily apply a force to the operating portion 50 of the elastic member 40' in order to operate the elastic portion 52 of the elastic member 40'.

Preferably, the bracket 60 is provided adjacent to the first end portion 58a of the extending support frame 58, and the bracket 60 includes an extension wall 74 and at least one mounting member 76. The extension wall 74 is connected (such as, but not limited to, fixedly connected) to the longitudinal portion 66 of the extending support frame 58 via at least one connecting wall section 78, and most of the extension wall 74 is in the support frame channel 72. The at least one mounting member 76 of the bracket 60 is disposed at one end of the extension wall 74 and is outside the support frame channel 72. The at least one mounting member 76 is configured to be mounted on the first post 30*a*, or in a mounting hole thereof, to be exact.

Preferably, the extension wall 74 of the bracket 60 includes at least one lug 80, and a shaft 82 extends through the fastener 62 and a portion of a slot 84 (or longitudinal hole) of the at least one lug 80 so that the fastener 62 can be pivoted with respect to the bracket 60 about the shaft 82. As the shaft 82 extends through the fastener 62 and only a portion of the slot 84 of the at least one lug 80, the fastener 62 can also be displaced to a limited extent along the extending direction of the slot 84. In addition, the extension wall 74 is provided with an abutting feature 81 adjacent to the slot 84.

Preferably, the fastener 62 includes at least one fastening portion 83 and a guiding portion 85 adjacent to the fastening portion 83. The guiding portion 85 is, for example, an inclined surface or a curved surface; the present invention has no limitation in this regard. The fastener 62 further includes a guiding section 87 (e.g., an inclined surface) corresponding to the abutting feature 81 so that the fastener 62 can be rotated from a locked position to an unlocked position when the bracket 60 and the fastener 62 are displaced to a limited extent with respect to each other through the slot 84.

Preferably, the first bracket device 26 further includes an auxiliary elastic member 86 for applying an elastic force to the fastener 62. More specifically, the auxiliary elastic member 86 has two ends connected respectively to a first connecting feature 88 of the bracket 60 and a second connecting feature 90 of the fastener 62.

Preferably, the rail member 24 has two opposite sides defined respectively as a first side S1 and a second side S2. The first bracket device 26 and the bracket mechanism 28 are located on the first side S1 while the at least one movable rail (32 and 34) is located on the second side S2. The bracket mechanism 28 includes at least one mounting member 92. The at least one mounting member 92 of the bracket mechanism 28 is configured to be mounted on the second post 30*b*, or in a mounting hole thereof, to be exact.

Figure 5:
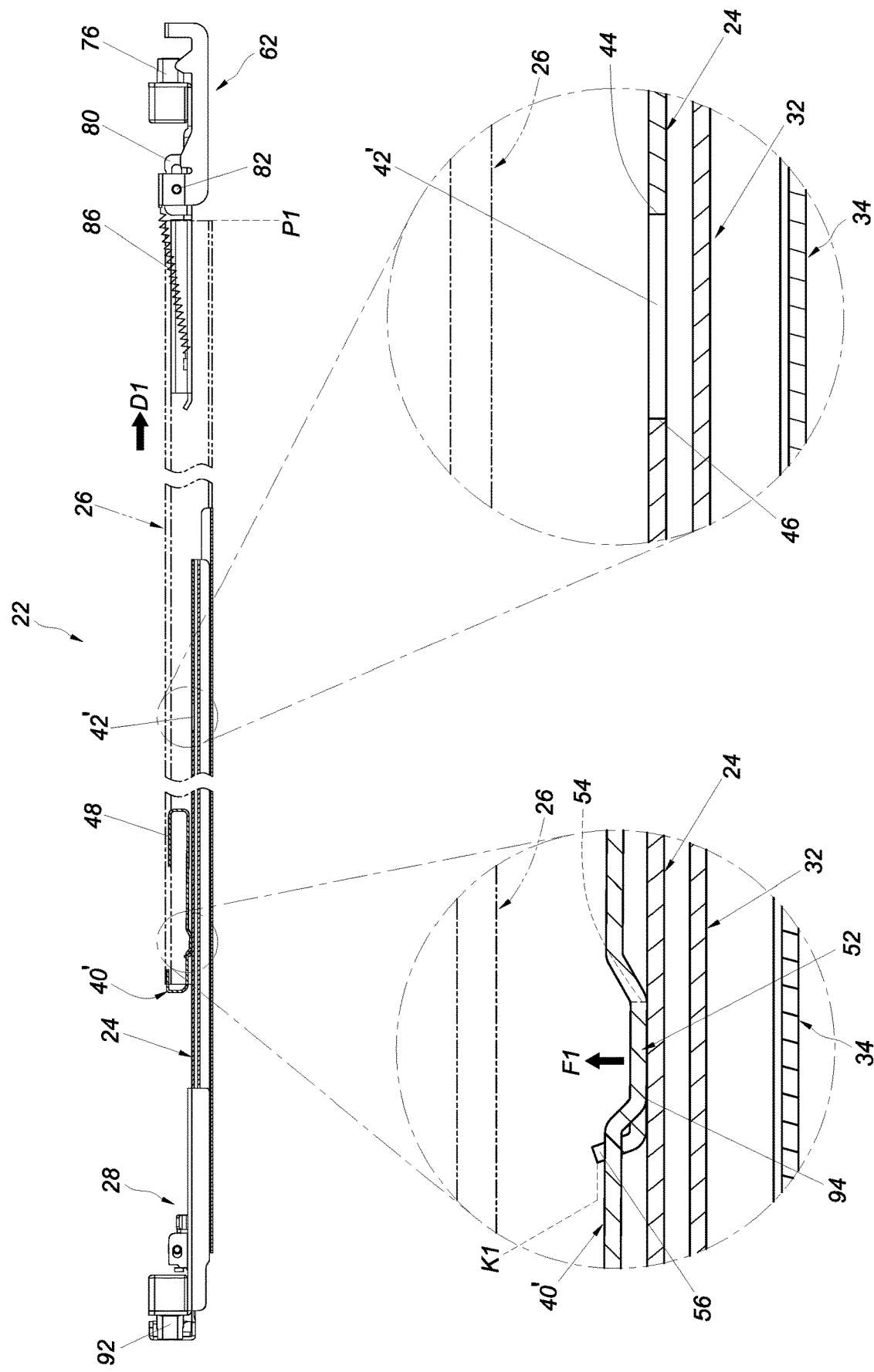
FIG. 5 shows that the rail member and the first bracket device of the slide rail assembly according to the embodiment of the present invention are at a retracted position with respect to each other.

FIG. 5 shows the first bracket device 26 at a retracted position P1 with respect to the rail member 24. At this position, the first structure 40 (e.g., the elastic member 40') of the first bracket device 26 is spaced apart from the second structure 42 (e.g., the space 42') of the rail member 24 by a predetermined distance, and the elastic portion 52 of the elastic member 40' is in a first state K1, in which the elastic portion 52 of the elastic member 40' abuts against a surface 94 of the first side S1 of the rail member 24 and stores an elastic force F1.

Figure 6:
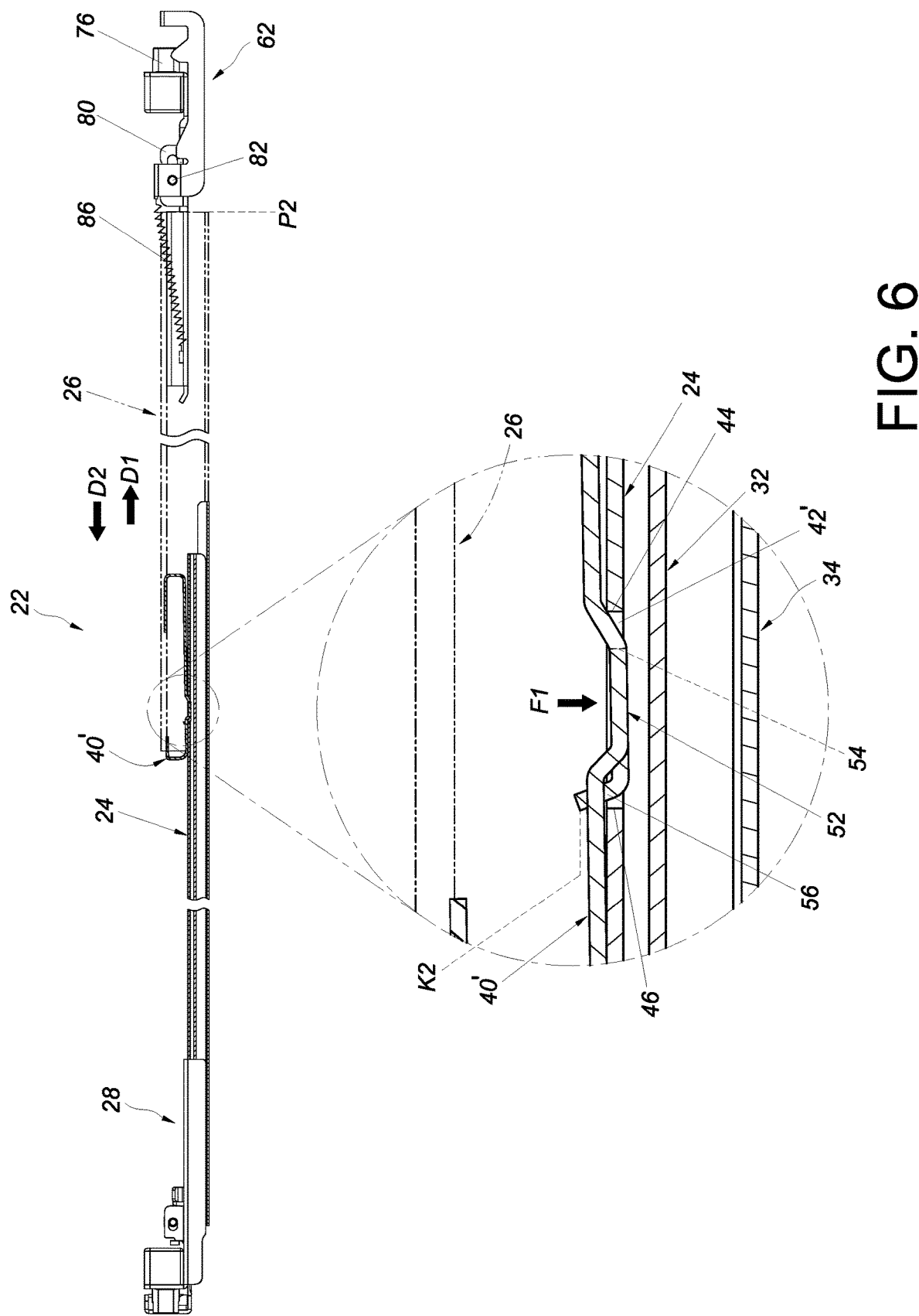
FIG. 6 shows that the rail member and the first bracket device of the slide rail assembly according to the embodiment of the present invention are at a predetermined position with respect to each other.

As shown in FIG. 5 and FIG. 6, the first bracket device 26 and the rail member 24 can be longitudinally displaced with respect to each other. For example, the first bracket device 26 can be longitudinally displaced with respect to the rail member 24 from the retracted position P1 (see FIG. 5) to a predetermined position P2 (e.g., an extended position, or more specifically a fully extended position, as shown in FIG. 6) in a first direction D1. The predetermined position P2 is the position at which the first bracket device 26 and the rail member 24 are located with respect to each other when the slide rail assembly 22 is mounted on the rack.

When the first bracket device 26 and the rail member 24 are at the predetermined position P2 with respect to each other (here, by way of example, it is the first bracket device 26 that is at the predetermined position P2 with respect to the rail member 24), the first structure 40 (e.g., the elastic member 40') and the second structure 42 (e.g., a wall portion of the space 42') are blocked by each other to prevent the first bracket device 26 and the rail member 24 from being displaced with respect to each other in either of the first direction D1 and a second direction D2 (see FIG. 6), wherein the first direction D1 and the second direction D2 are opposite directions. More specifically, when the first bracket device 26 and the rail member 24 are at the predetermined position P2 with respect to each other, the elastic portion 52 of the elastic member 40' releases the stored elastic force F1 such that the first blocking section 54 and the second blocking section 56 of the elastic portion 52 of the elastic member 40' correspond to the first wall portion 44 and the second wall portion 46 of the space 42' respectively and thereby provide a blocking function. If in this state an external force is applied to displace the first bracket device 26 and the rail member 24 with respect to each other, but the external force is less than the force generated by the elastic member 40', the first bracket device 26 and the rail member 24 will be prevented from being displaced with respect to each other in either of the first direction D1 and the second direction D2.

Figure 7:
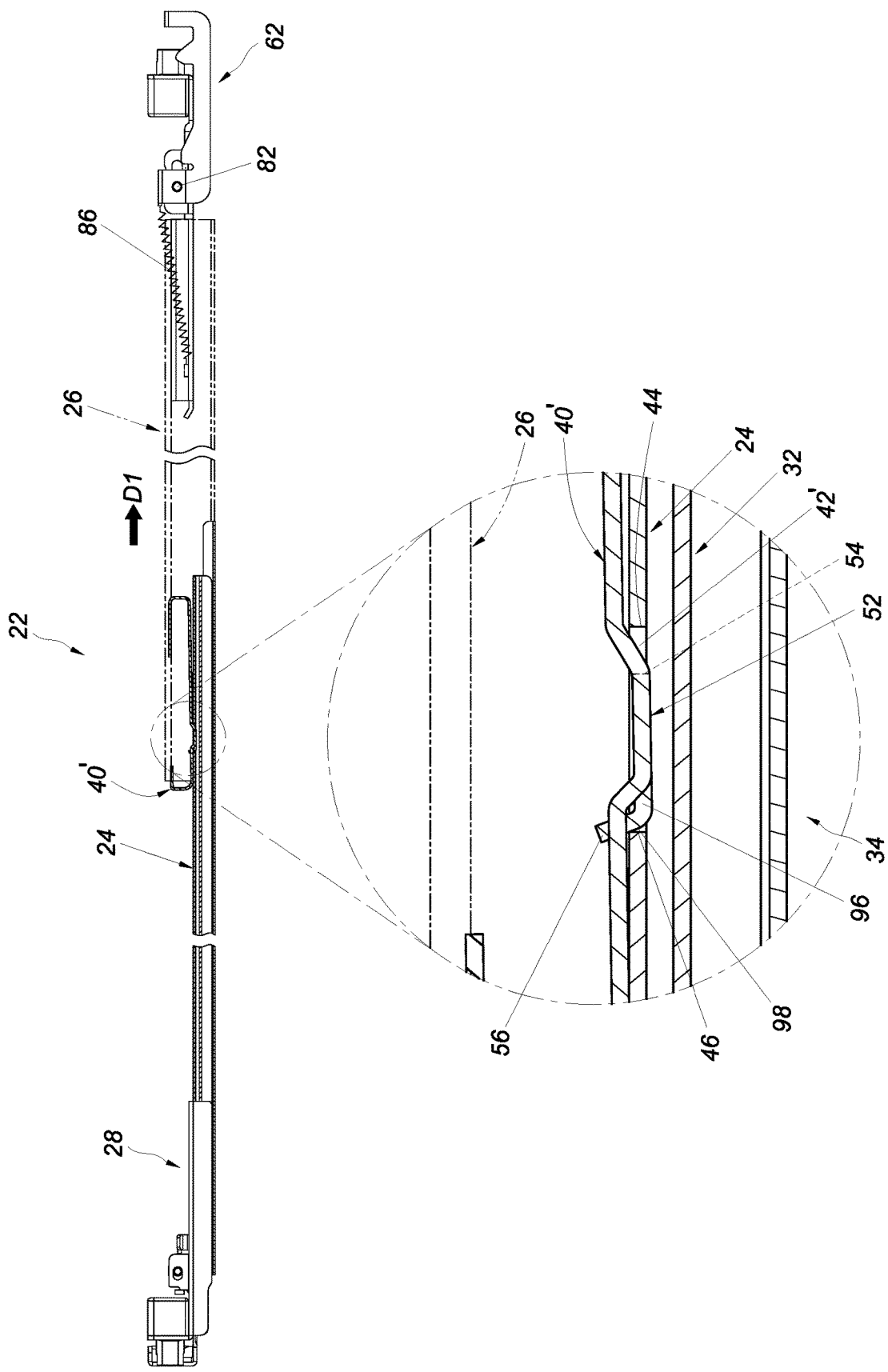
FIG. 7 shows that the rail member of the slide rail assembly according to the embodiment of the present invention is displaced with respect to the first bracket device in a first direction.
Figure 8:
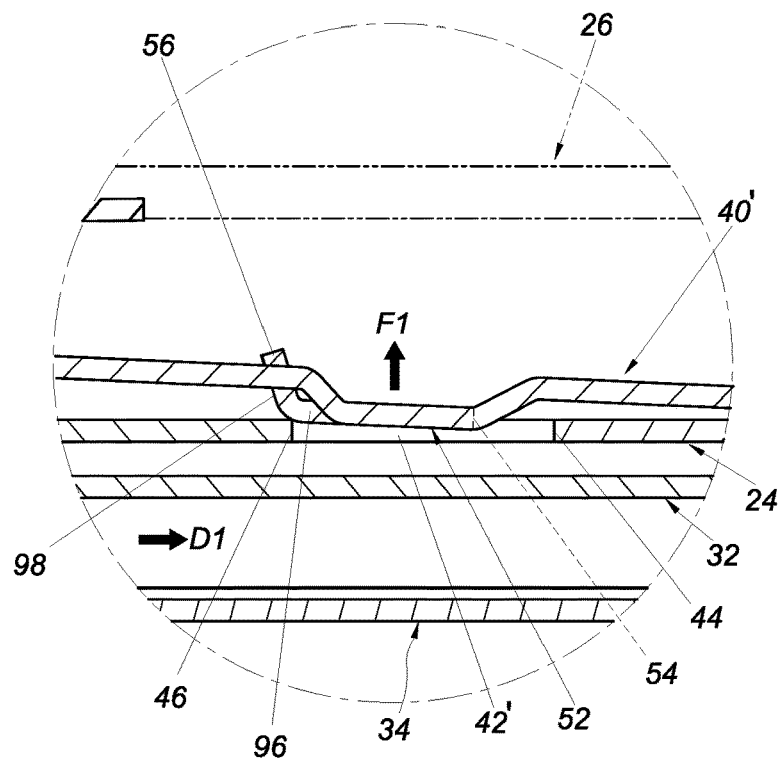
FIG. 8 shows that the rail member of the slide rail assembly according to the embodiment of the present invention is further displaced with respect to the first bracket device in the first direction.
Figure 9:
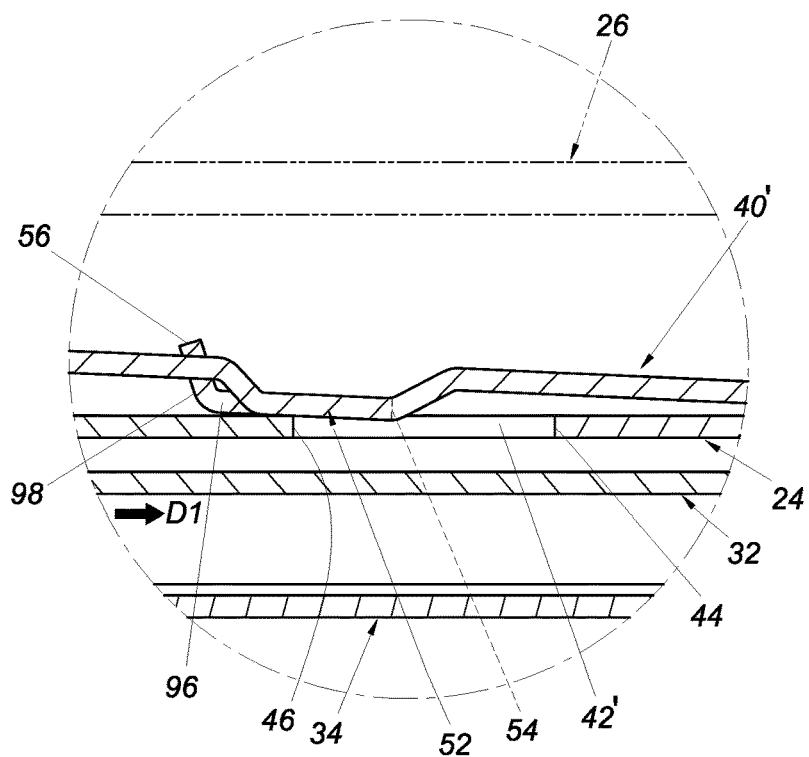
FIG. 9 shows that the rail member of the slide rail assembly according to the embodiment of the present invention is displaced even further with respect to the first bracket device in the first direction.

As shown in FIG. 7 to FIG. 9, the second blocking section 56 is bent at a predetermined angle with respect to a predetermined section 96 of the elastic portion 52 and thus forms a guiding feature 98. The guiding feature 98 is, for example, an inclined surface or a curved surface and is configured to work with the second wall portion 46 of the space 42'. Preferably, the second blocking section 56 and the predetermined section 96 of the elastic portion 52 form an obtuse included angle therebetween (i.e., the included angle is greater than 90 degrees, preferably ranging from 100 to 130 degrees) so that while the second blocking section 56 and the second wall portion 46 of the space 42' can correspond to each other to provide a blocking function, the blocking function can be removed by applying to one of the rail member 24 and the first bracket device 26 an external force that is great enough to overcome the elastic force of the elastic member 40'. Moreover, the guiding feature 98 allows the removal of the blocking function to be non-destructive; that is to say, the first bracket device 26 and the rail member 24 can be brought back to the predetermined position P2 with respect to each other so that the first structure 40 (e.g., the elastic member 40') and the second structure 42 (e.g., a wall portion of the space 42') are blocked by each other again. In other words, the blocking function can be, and will be, removed as long as the external force applied to effect relative displacement between the first bracket device 26 and the rail member 24 is greater than the force generated by the elastic member 40'.

For example, when the first bracket device 26 and the rail member 24 are at the predetermined position P2 with respect to each other (see FIG. 6), the blocking relationship between the first bracket device 26 and the rail member 24 can be terminated by applying to, for example, the rail member 24 an external force that acts in the first direction D1 so that the rail member 24 is displaced with respect to the first bracket device 26, the objective being for the second wall portion 46 of the space 42' of the rail member 24 to contact the guiding feature 98 of the second blocking section 56 of the elastic member 40' and then push the elastic portion 52 of the elastic member 40' by way of, and as is made easy by, the guiding feature 98 of the second blocking section 56 (see FIG. 7). If the external force is great enough to overcome the elastic force F1 of the elastic portion 52 of the elastic member 40', the elastic portion 52 of the elastic member 40' will be deflectively biased to rotate through an angle (see FIG. 8) such that the first blocking section 54 and the second blocking section 56 of the elastic portion 52 of the elastic member 40' no longer correspond to the first wall portion 44 and the second wall portion 46 of the space 42' respectively (see FIG. 8), and the blocking function is thus removed. The rail member 24 is then allowed to be displaced with respect to the first bracket device 26 in, for example, the first direction D1 (see FIG. 9) until the rail member 24 and the first bracket device 26 reach the retracted position P1 after being retracted with respect to each other.

Figure 10:
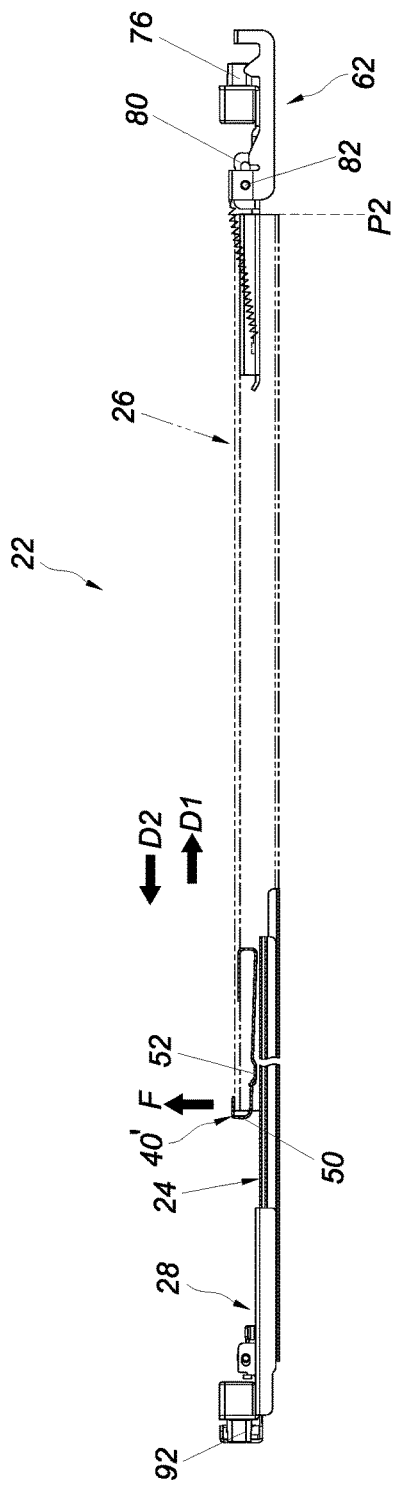
FIG. 10 shows that the first bracket device of the slide rail assembly according to the embodiment of the present invention is displaced with respect to the rail member from the predetermined position in the first direction.
Figure 11:
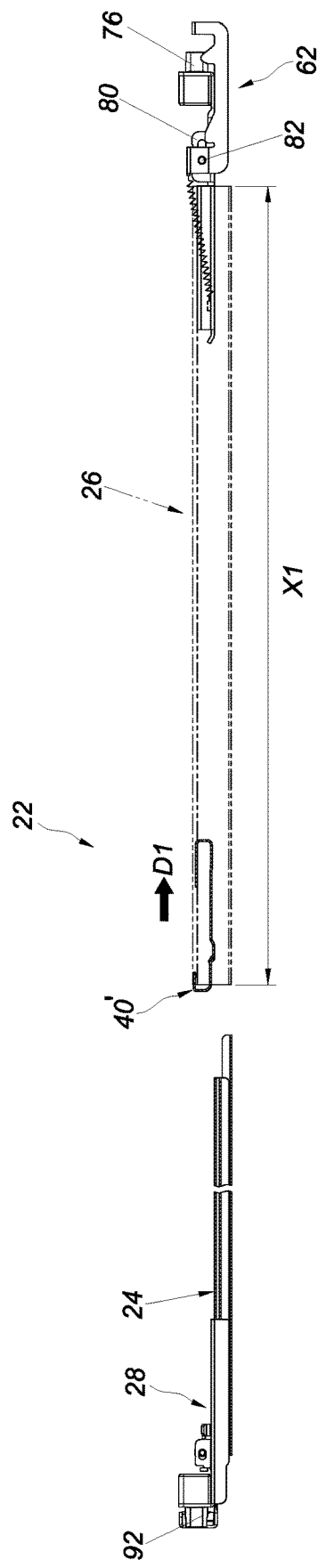
FIG. 11 shows that the first bracket device of the slide rail assembly according to the embodiment of the present invention is detached from the rail member after being displaced with respect to the rail member in the first direction.

Referring to FIG. 10 and FIG. 11, when the first bracket device 26 and the rail member 24 are at the predetermined position P2 with respect to each other (see FIG. 10), a user may also apply an operating force F to the operating portion 50 of the elastic member 40' so that the first blocking section 54 and the second blocking section 56 of the elastic portion 52 of the elastic member 40' no longer correspond to the first wall portion 44 and the second wall portion 46 of the space 42' respectively (see also FIG. 8), e.g., with the elastic portion 52 of the elastic member 40' being deflectively biased to rotate through an angle such that the first blocking section 54 and the second blocking section 56 of the elastic portion 52 are stopped from blocking, and being blocked by, the first wall portion 44 and the second wall portion 46 of the space 42' respectively (see also FIG. 8), thereby allowing the first bracket device 26 and the rail member 24 to be displaced with respect to each other in either of the first direction D1 and the second direction D2.

For example, when the elastic member 40' no longer blocks, and is no longer blocked by, the first wall portion 44 of the space 42' (see FIG. 8), the first bracket device 26 can be displaced with respect to the rail member 24 in the first direction D1 and then detached from the rail member 24 (see FIG. 11). The first bracket device 26 has a first length X1.

Figure 12:
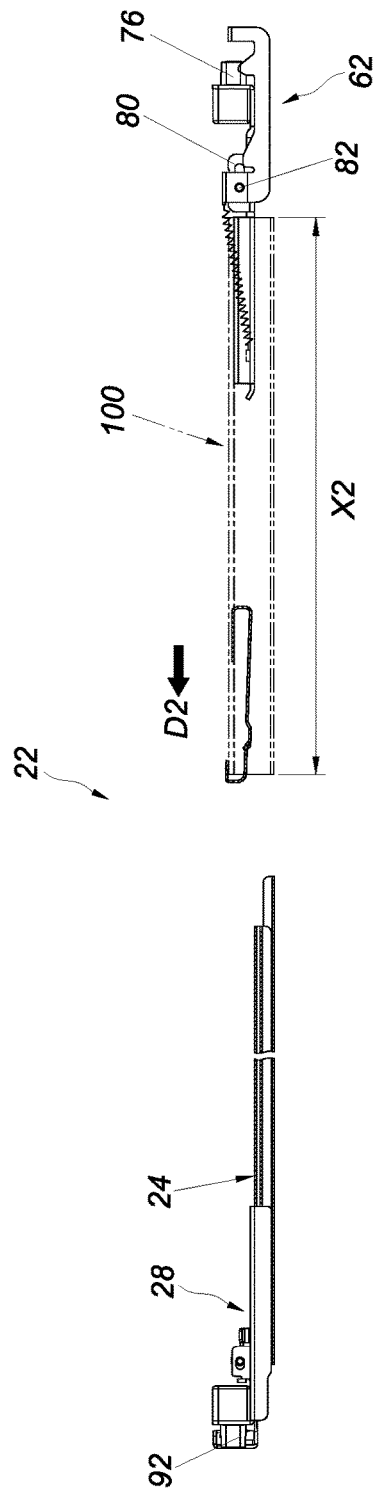
FIG. 12 shows that a second bracket device of the slide rail assembly according to the embodiment of the present invention is being mounted to the rail member of the slide rail assembly in a second direction.
Figure 13:
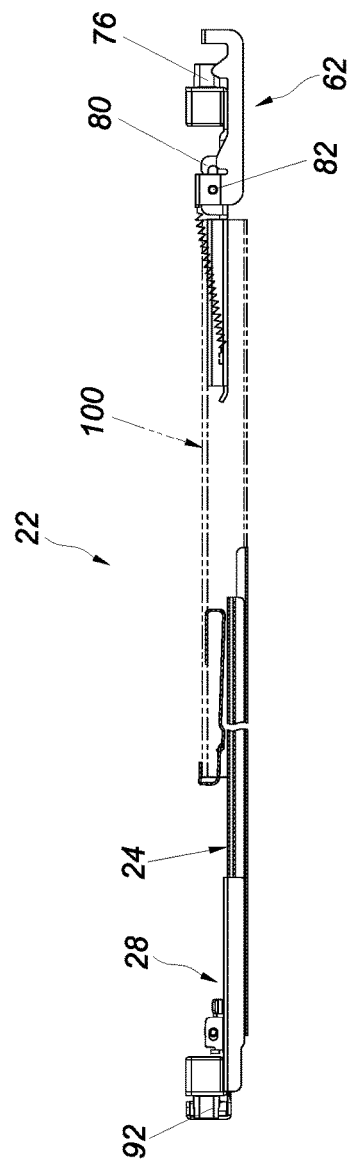
FIG. 13 shows that the second bracket device of the slide rail assembly according to the embodiment of the present invention is further displaced in the second direction in order to be mounted on the rail member of the slide rail assembly.

Referring to FIG. 12 and FIG. 13, the slide rail assembly 22 further includes a second bracket device 100 having a second length X2 different from the first length X1. Here, the second length X2 is less than, or shorter than, the first length X1 by way of example. The second bracket device 100 has substantially the same structural configuration as the first bracket device 26 and, for the sake of brevity, will not be described any further. Once the first bracket device 26 is detached from the rail member 24, the second bracket device 100 can be mounted to the rail member 24 in the second direction D2.

Figure 14:
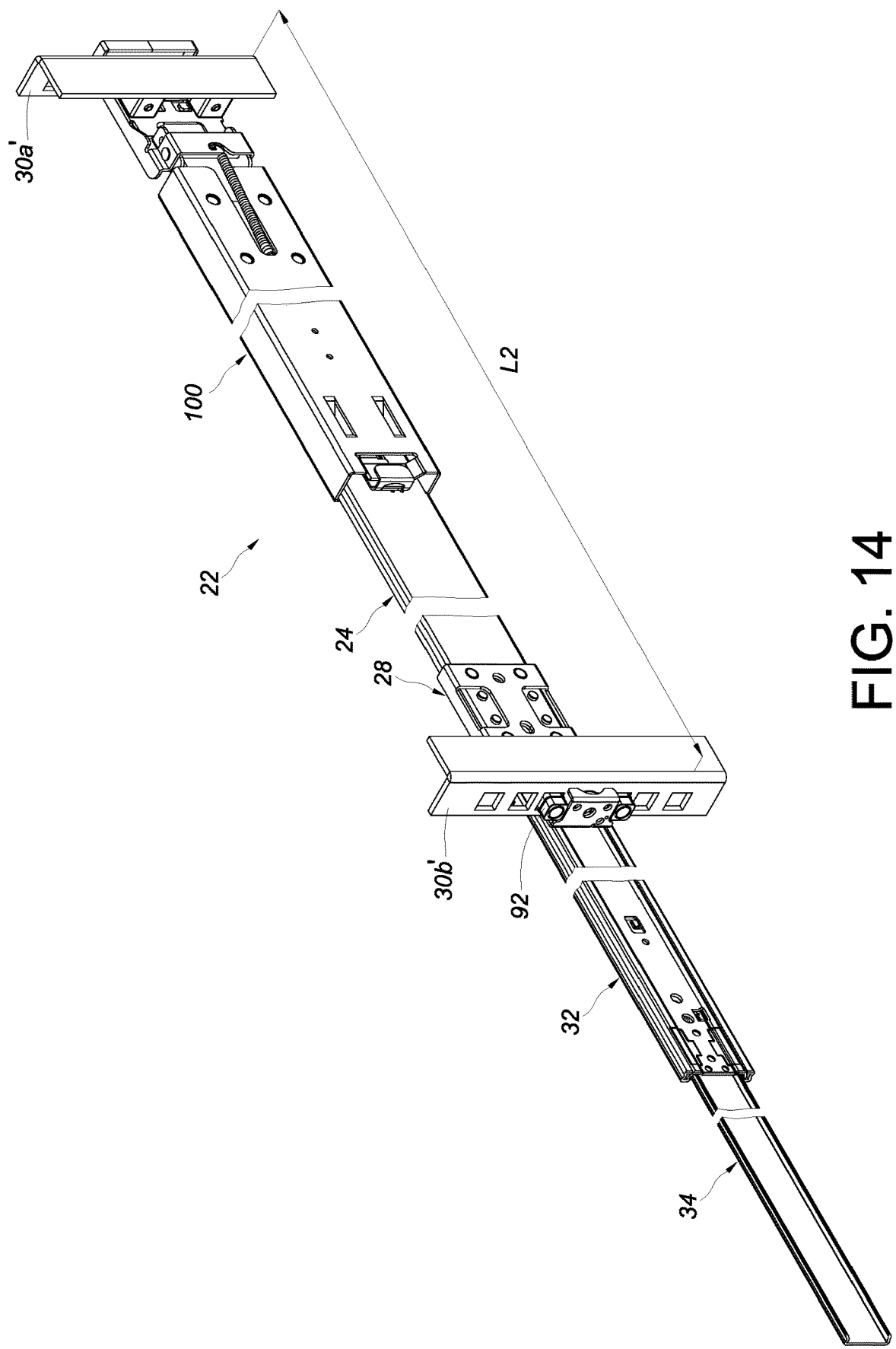
FIG. 14 shows that the slide rail assembly according to the embodiment of the present invention is mounted on another rack.

Referring to FIG. 14, the second bracket device 100 can be mounted on a first post 30a' of another rack (hereinafter referred to as the second rack), and the rail member 24 can be mounted on a second post 30b' of the second rack via the bracket mechanism 28. The first post 30a' and the second post 30b' define a second longitudinal distance L2 (or a second rack depth) therebetween. A user, therefore, may replace the first bracket device 26 with the second bracket device 100 or vice versa in order to adapt the slide rail assembly 22 to racks of different depths.

Figure 15:
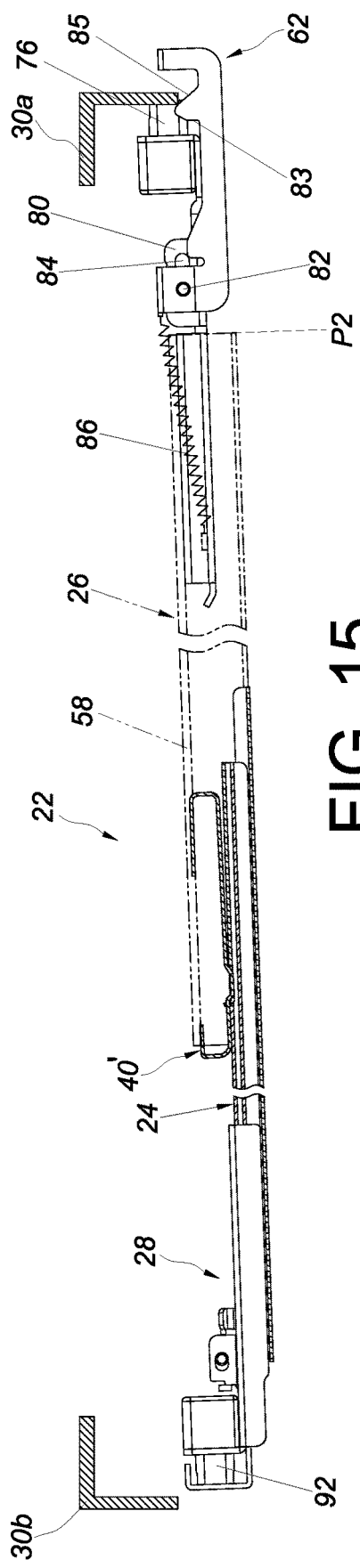
FIG. 15 shows the first step of mounting the slide rail assembly on the rack in accordance with the embodiment of the present invention.
Figure 16:
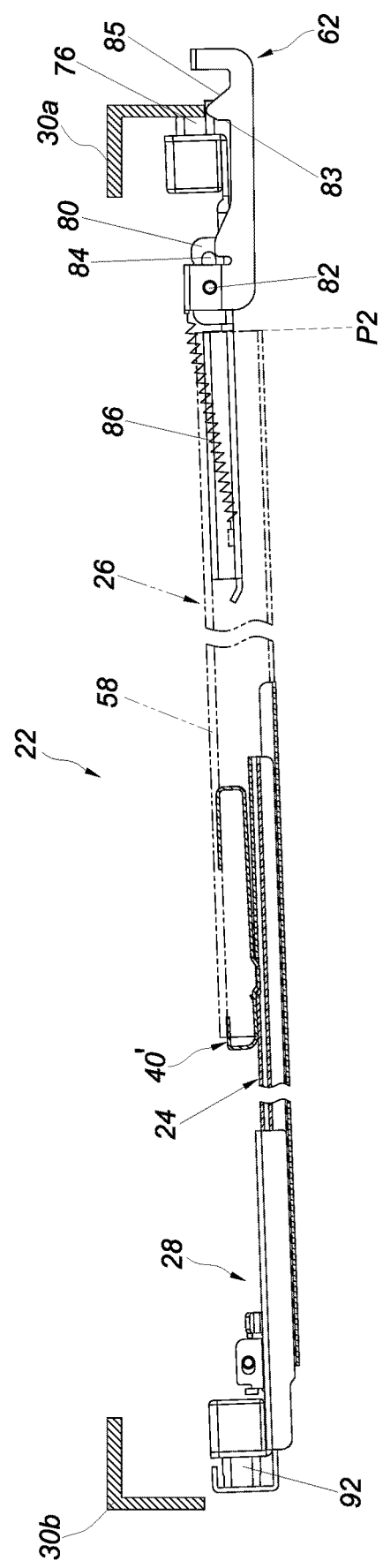
FIG. 16 shows the second step of mounting the slide rail assembly on the rack in accordance with the embodiment of the present invention.

Referring to FIG. 15 to FIG. 17, the rail member 24 is mounted with the first bracket device 26, and the first bracket device 26 is at the predetermined position P2 with respect to the rail member 24. Now that the first structure 40 and the second structure 42 can be blocked by each other (e.g., with the first blocking section 54 and the second blocking section 56 of the elastic portion 52 of the elastic member 40' blocking, and blocked by, the first wall portion 44 and the second wall portion 46 of the space 42' respectively), the first bracket device 26 can be temporarily kept at the predetermined position P2 with respect to the rail member 24 by such blockage (see also FIG. 6); in other words, the first bracket device 26 and the rail member 24 can be temporarily kept at the predetermined position P2 with respect to each other by such blockage.

To mount the slide rail assembly 22 on the rack, a user may stand at a position adjacent to, for example, the second post 30b and begin by mounting the first bracket device 26 on the first post 30a while holding the rail member 24. During the process, the guiding portion 85 of the fastener 62 of the first bracket device 26 is brought into contact with the first post 30a (see FIG. 15), and then the fastener 62 is rotated through an angle as is made easy by the contact between the guiding portion 85 and the first post 30a. As a result, the auxiliary elastic member 86 stores an elastic force (see FIG. 16). When the at least one mounting member 76 is inserted into the first post 30a (or into a mounting hole thereof, to be exact), and the fastener 62 has moved past the first post 30a, the auxiliary elastic member 86 releases the stored elastic force and thereby brings the fastener 62 into a locked state, in which the fastening portion 83 of the fastener 62 is locked to the first post 30a to complete the step of mounting the first bracket device 26 on the first post 30a (see FIG. 17).

Once the first bracket device 26 is mounted on the first post 30a, referring to FIG. 18 and FIG. 19, the user applies to the rail member 24 a force acting in the first direction D1 so that the rail member 24 is displaced in the first direction D1 with respect to the first bracket device 26, which is now mounted (or fixed) on the first post 30a, the objective being for the second wall portion 46 of the space 42' of the rail member 24 to push the elastic portion 52 of the elastic member 40' through the guiding feature 98 of the second blocking section 56 and thereby rotate the elastic portion 52 through an angle (see FIG. 18, or refer to the description in relation to FIG. 8 and FIG. 9 for details, which will not be repeated here). Consequently, the first blocking section 54 and the second blocking section 56 of the elastic portion 52 of the elastic member 40' cease to correspond to the first wall portion 44 and the second wall portion 46 of the space 42' respectively (i.e., the rail member 24 and the first bracket device 26 are no longer at the predetermined position P2 with respect to each other), and the blocking function is thus removed (see FIG. 18). The rail member 24 is then allowed to be displaced with respect to the first bracket device 26 in, for example, the second direction D2 until the mounting member 92 of the bracket mechanism 28 is inserted into the second post 30b (or into a mounting hole thereof, to be exact) to mount the rail member 24 on the second post 30b and thereby complete the process of mounting the slide rail assembly 22 on the rack (see FIG. 19). It can be known from the above that the process of mounting the slide rail assembly 22 on the rack can be completed by a single person.

It is worth mentioning that when it is desired to detach the slide rail assembly 22 from the rack, the user may stand at a position adjacent to, for example, the second post 30b and begin by detaching the bracket mechanism 28 from the second post 30b (see FIG. 17). After that, the user may pull the first bracket device 26 or the rail member 24 in order to displace the bracket 60 and the fastener 62 to a limited extent with respect to each other, the objective being for the abutting feature 81 and the guiding section 87 to interact with each other and thereby bring the fastener 62 from a locked position (at which the fastener 62 is engaged with the first post 30*a*) to an unlocked position (at which the fastener 62 is separate from the first post 30*a*) and hence allows the first bracket device 26 to be detached from the first post 30*a*. It can be known from the above that the process of detaching the slide rail assembly 22 from the rack can also be completed by a single person.

According to the above, the slide rail assembly 22 disclosed in the foregoing embodiment has the following features:

1. When the first bracket device 26 and the rail member 24 are at the predetermined position P2 (e.g., an extended position) with respect to each other, the first structure 40 (e.g., the elastic member 40') and the second structure 42 (e.g., the space 42') are blocked by each other to prevent the first bracket device 26 and the rail member 24 from being displaced with respect to each other in either of the first direction D1 and the second direction D2.
2. The slide rail assembly 22 includes the first bracket device 26 and the second bracket device 100, and the two bracket devices have different lengths so that a user may mount either bracket device to the rail member 24 to adapt the slide rail assembly 22 to racks of different depths.
3. When the first bracket device 26 is at the predetermined position P2 with respect to the rail member 24, the first structure 40 and the second structure 42 are blocked by each other, e.g., with the first blocking section 54 and the second blocking section 56 (which has the guiding feature 98) of the elastic portion 52 of the elastic member 40' blocking, and blocked by, the first wall portion 44 and the second wall portion 46 of the space 42' respectively, such that the first bracket device 26 is temporarily kept at the predetermined position P2 with respect to the rail member 24.
4. A single person can complete the process of mounting the slide rail assembly 22 on the rack and of detaching the slide rail assembly 22 from the rack.
5. The second blocking section 56 is bent at the predetermined angle with respect to the predetermined section 96 of the elastic portion 52 and thus forms the guiding feature 98, which makes it easier for the elastic portion 52 of the elastic member 40' to be rotated through an angle to terminate the blocking relationship between the rail member 24 and the first bracket device 26 when the rail member 24 and the first bracket device 26 are at the predetermined position P2 with respect to each other.

While the present invention has been disclosed through the embodiment described above, it should be understood that the embodiment is not intended to be restrictive of the scope of the invention. The scope of the patent protection sought by the applicant is defined by the appended claims.

What is claimed is:

1. A slide rail assembly, comprising:
    a rail member; and
    a first bracket device displaceable with respect to the rail member;
    wherein the first bracket device is provided with a first structure, and the rail member is provided with a second structure;
    wherein the first structure and the second structure are configured to be blocked by each other when the first bracket device and the rail member are at a predetermined position with respect to each other; one of the first structure and the second structure is an elastic member and the other of the second structure and the first structure is a space; when the first structure and the second structure are blocked by each other, and an external force applied to effect relative displacement between the first bracket device and the rail member is less than a force generated by the elastic member, the first bracket device and the rail member are prevented from displacement with respect to each other in either of a first direction and an opposing second direction; and when the first structure and the second structure are blocked by each other, and the external force applied to effect relative displacement between the first bracket device and the rail member is greater than the force generated by the elastic member, said blockage of the first structure and the second structure by each other is removed in a non-destructive manner; and
    wherein the elastic member includes a connecting portion, an operating portion, and an elastic portion located between the connecting portion and the operating portion; the connecting portion is connected to one of the first bracket device and the rail member; the elastic portion includes a first blocking section and a second blocking section; and when the first bracket device and the rail member are at the predetermined position with respect to each other, the first blocking section and the second blocking section of the elastic portion of the elastic member correspond to a first wall portion and a second wall portion of the space respectively to prevent the first bracket device and the rail member from displacement with respect to each other in either of the first direction and the second direction.

2. The slide rail assembly of claim 1, wherein the elastic member is configured to be operated so as to stop blocking, and being blocked by, the other of the first structure and the second structure, thereby allowing the first bracket device and the rail member to be displaced with respect to each other in either of the first direction and the second direction.

3. The slide rail assembly of claim 2, wherein when the elastic member stops blocking, and being blocked by, the other of the first structure and the second structure, the first bracket device is displaceable with respect to the rail member in the first direction in order to be detached from the rail member.

4. The slide rail assembly of claim 3, wherein the first bracket device has a first length, the slide rail assembly further comprises a second bracket device having a second length different from the first length, and the second bracket device is configured to be mounted to the rail member in the second direction after the first bracket device is detached from the rail member.

5. The slide rail assembly of claim 1, wherein when the first bracket device and the rail member are at the predetermined position with respect to each other, and the elastic member is operated, the first blocking section and the second blocking section of the elastic portion of the elastic member are stopped from corresponding to the first wall portion and the second wall portion of the space respectively, thereby allowing the first bracket device and the rail member to be displaced with respect to each other in either of the first direction and the second direction.

6. The slide rail assembly of claim 1, wherein the second blocking section has a guiding feature, and the guiding feature is configured to work with the second wall portion of the space.

7. The slide rail assembly of claim 1, wherein the elastic member is provided at a position adjacent to an end portion of the first bracket device.

8. The slide rail assembly of claim 1, wherein the rail member is further provided with a bracket mechanism, the first bracket device is configured to be mounted on a first post of a rack, and the rail member is configured to be mounted on a second post of the rack via the bracket mechanism.

9. The slide rail assembly of claim 1, further comprising at least one movable rail displaceable with respect to the rail member.

10. A slide rail assembly, comprising:
a rail member; and
a first bracket device displaceable with respect to the rail member between a retracted position and an extended position;
wherein the first bracket device is provided with a first structure, and the rail member is provided with a second structure;
wherein one of the first structure and the second structure is an elastic member and the other of the second structure and the first structure is a space;
wherein the first structure and the second structure are configured to be blocked by each other when the first bracket device reaches the extended position after displacement with respect to the rail member from the retracted position in a first direction; when the first structure and the second structure are blocked by each other, and an external force applied to effect relative displacement between the first bracket device and the rail member is less than a force generated by the elastic member, the first bracket device is prevented from displacement with respect to the rail member in either of the first direction and an opposing second direction; and when the first structure and the second structure are blocked by each other, and the external force applied to effect relative displacement between the first bracket device and the rail member is greater than the force generated by the elastic member, said blockage of the first structure and the second structure by each other is removed; and
wherein the the elastic member includes a connecting portion, an operating portion, and an elastic portion located between the connecting portion and the operating portion; the connecting portion is connected to one of the first bracket device and the rail member; the elastic portion includes a first blocking section and a second blocking section; and when the first bracket device is at the extended position with respect to the rail member, the first blocking section and the second blocking section of the elastic portion of the elastic member correspond to a first wall portion and a second wall portion of the space respectively to prevent the first bracket device from displacement with respect to the rail member in either of the first direction and the second direction.

11. The slide rail assembly of claim 10, wherein the elastic member is configured to be operated so as to stop blocking, and being blocked by, the other of the first structure and the second structure, thereby allowing the first bracket device to be displaced with respect to the rail member in either of the first direction and the second direction.

12. The slide rail assembly of claim 11, wherein when the elastic member stops blocking, and being blocked by, the other of the first structure and the second structure, the first bracket device is displaceable with respect to the rail member in the first direction in order to be detached from the rail member.

13. The slide rail assembly of claim 12, wherein the first bracket device has a first length, the slide rail assembly further comprises a second bracket device having a second length different from the first length, and the second bracket device is configured to be mounted to the rail member in the second direction after the first bracket device is detached from the rail member.

14. The slide rail assembly of claim 10, wherein when the first bracket device is at the extended position with respect to the rail member, and the elastic member is operated, the first blocking section and the second blocking section of the elastic portion of the elastic member are stopped from corresponding to the first wall portion and the second wall portion of the space respectively, thereby allowing the first bracket device to be displaced with respect to the rail member in either of the first direction and the second direction.

15. The slide rail assembly of claim 10, wherein the second blocking section has a guiding feature, and the guiding feature is configured to work with the second wall portion of the space.

16. The slide rail assembly of claim 10, wherein the rail member is further provided with a bracket mechanism, the first bracket device is configured to be mounted on a first post of a rack, and the rail member is configured to be mounted on a second post of the rack via the bracket mechanism.

17. A slide rail assembly, comprising:
a rail member having a space, wherein the space has a first wall portion and a second wall portion; and
a first bracket device displaceable with respect to the rail member, wherein the first bracket device is provided with an elastic member, and the elastic member includes a first blocking section and a second blocking section;
wherein when the first bracket device and the rail member are at an extended position with respect to each other, the first blocking section and the second blocking section of the elastic member correspond to the first wall portion and the second wall portion of the space respectively to prevent the first bracket device and the rail member from displacement with respect to each other in either of a first direction and a second direction;
wherein the elastic member is configured to be operated so as to stop the first blocking section and the second blocking section of the elastic member from corresponding to the first wall portion and the second wall portion of the space respectively, thereby allowing the first bracket device to be displaced with respect to the rail member in the first direction in order to be detached from the rail member.

18. The slide rail assembly of claim 17, wherein the first bracket device has a first length, the slide rail assembly further comprises a second bracket device having a second length different from the first length, the second bracket device is configured to be mounted to the rail member in the second direction after the first bracket device is detached from the rail member, and the first direction and the second direction are opposite directions.

* * * * *